(12) United States Patent
Kropp et al.

(10) Patent No.: US 8,933,735 B2
(45) Date of Patent: Jan. 13, 2015

(54) CLOCK GENERATION CIRCUIT

(75) Inventors: Holger Kropp, Wedemark (DE); Herbert Schuetze, Celle (DE); Stefan Abeling, Schwarmstedt (DE)

(73) Assignee: Thomson Licensing, Issy les Moulineaux (FR)

( * ) Notice: Subject to any disclaimer, the term of this patent is extended or adjusted under 35 U.S.C. 154(b) by 0 days.

(21) Appl. No.: 14/232,257

(22) PCT Filed: Jul. 12, 2012

(86) PCT No.: PCT/EP2012/063658
§ 371 (c)(1),
(2), (4) Date: Jan. 11, 2014

(87) PCT Pub. No.: WO2013/010901
PCT Pub. Date: Jan. 24, 2013

(65) Prior Publication Data
US 2014/0145770 A1   May 29, 2014

(30) Foreign Application Priority Data

Jul. 15, 2011  (EP) .................................... 11305929

(51) Int. Cl.
*H03L 7/06* (2006.01)
(52) U.S. Cl.
USPC ......................................... 327/158; 327/149
(58) Field of Classification Search
USPC .................................. 327/147–149, 156–158
See application file for complete search history.

(56) References Cited

U.S. PATENT DOCUMENTS 5,939,912 A * 8/1999 Rehm .......................... 327/158
7,199,625 B1 * 4/2007 Chung .......................... 327/149

(Continued)

OTHER PUBLICATIONS

Minami K et al: "A 1-GHZ Portable Digital Delay-Locked Loop With Infinite Phase Capture Ranges", IEICE Transactions on Electronics, Institute of Electronics, Tokyo, JP, vol. E84-C, No. 2, Feb. 1, 2001, pp. 220-228.

(Continued)

*Primary Examiner* — Adam Houston
(74) *Attorney, Agent, or Firm* — Robert D. Shedd; Patricia Verlangieri (57) ABSTRACT

A clock generation circuit comprises an internal clock signal source providing an internal clock signal and a synchronization device for synchronization the internal clock signal with a reference clock signal provided externally from the clock generation circuit. The synchronization device comprises n delay locked loop circuits, n being an integer greater than 1, each delay locked loop circuit having a clock input for receiving the internal clock signal and a clock output for providing an output clock signal with an individual phase shift that is adjustable. The synchronization device further comprises a multiplexer having n inputs and an output wherein each of the n inputs is connected to an output of one of the n delay locked loops and a control circuit. The control circuit is adapted to adjust at least one of the delay locked loop circuits for providing an individual phase shift according to a current phase shift and to select that input of the multiplexer that receives an output clock signal of the adjusted delay locked loop circuit that is synchronized in frequency and phase with the reference clock signal, wherein the output of the multiplexer provides that output clock signal as synchronized clock signal, and wherein the control circuit is adapted to toggle between the n delay locked loop circuits, in a way that the phase of the internal clock signal is successively shifted according to the current phase shift between the internal clock signal and the reference clock signal.

3 Claims, 7 Drawing Sheets

(56) References Cited

U.S. PATENT DOCUMENTS

| | | | |
|---|---|---|---|
| 8,358,547 B2* | 1/2013 | Choi | 365/194 |
| 8,675,428 B2* | 3/2014 | Choi | 365/194 |
| 2001/0026183 A1* | 10/2001 | Kim | 327/276 |
| 2004/0070431 A1 | 4/2004 | Henrickson | |
| 2008/0042705 A1* | 2/2008 | Kim et al. | 327/158 |
| 2009/0267665 A1* | 10/2009 | Lee et al. | 327/158 |
| 2011/0164462 A1* | 7/2011 | Choi | 365/194 |
| 2012/0311372 A1* | 12/2012 | Iijima | 713/503 |
| 2013/0120043 A1* | 5/2013 | Choi | 327/158 |

OTHER PUBLICATIONS

Xilinx-Virtex-5 FPGA User Guide; UG190, Mar. 16, 2012, pp. 1-385.

Xilinx-Virtex-5 FPGA Data Sheet: DC and Switchers Characteristics,, DS202, May 5, 2010,pp. 1-91.

Search Report Dated Oct. 1, 2012.

* cited by examiner

Prior Art

CLOCK GENERATION CIRCUIT

This application claims the benefit, under 35 U.S.C. §365 of International Application PCT/EP2012/063658, filed Jul. 12, 2012, which was published in accordance with PCT Article 21(2) on Jan. 24, 2013 in English and which claims the benefit of European patent application No. 11305929.9, filed Jul. 15, 2011.

FIELD OF THE INVENTION

The present invention relates to a clock generation circuit providing synchronization of an internal clock signal with an externally provided clock signal based on alternating selected delay locked loops (DLLs).

BACKGROUND OF THE INVENTION

If a transmitter and a receiver are interchanging data via a transmission system, their respective local clock generators must be synchronized with each other or with a global clock.

Local clock generators of components of a transmission system are typically selected to provide a clock signal having the same nominal frequency. However, due to jitter and drift effects caused internally, inter alia, by temperature variations and ageing, almost unavoidably phase differences, at least temporally, between the clock signals of any two local clock generators in the transmission system. Systems with nominally identical clock frequencies but small frequency and phase deviations are also referred to as plesiochronous systems. The clock generation circuit and its principle of operation described in this specification are related to such plesiochronous systems.

Synchronization in a plesiochronous system is a matter of balancing the phase drifts between the local clock signals caused by slightly differing clock frequencies. Conventionally, these phase drifts are compensated for by analog and/or digital phase-locked loop circuits, or PLLs. Another application for PLL circuits is management of board-level skew. As faster switching technologies have become available, it has become necessary to use such circuits to minimize skew within various printed circuit boards, or PCBs, of an apparatus, or even within a single printed circuit board.

A PLL detects possible phase shifts between the frequency of a reference input signal and the frequency of a controllable signal source and modifies the frequency and the phase of the controllable signal source until the phase difference between the reference input signal and the signal of the controllable signal source is eliminated.

Figure 1:
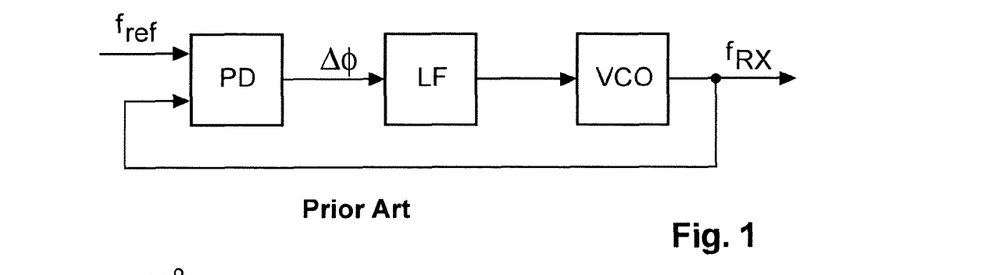
FIG. 1 shows a block diagram with a PLL (prior art)

FIG. 1 shows the main blocks used in a PLL e.g. in a receiver. Reference signal $f_{ref}$ is applied to a first input of phase detector PD. Output signal $f_{RX}$ of controllable oscillator VCO (voltage controlled oscillator) located in the receiver is applied to a second input of phase detector PD. The resulting signal $\Delta\phi$ indicative of the phase difference is applied to the controllable oscillator VCO via a loop filter LF and controls the frequency of the controllable oscillator VCO. The loop filter LF reduces the effects of spurious variations and also slows down the response of the VCO so as to limit unwanted oscillation of the control signal, which may cause unwanted jitter in the VCO's output signal. However, this generally slows down the speed of tracking frequency drifts. Typically, elements of the circuit adding significant delay are included in the feedback loop, such that the effective delay can be minimized or even eliminated.

PLLs, however, are relatively costly and difficult to integrate into digital ICs. The controllable oscillator VCO often is build discrete or manually trimmed to the desired accuracy, which makes such components expensive. Also, additional analog components are required, resulting into solutions that are sensitive to noise and temperature, especially if very accurate frequencies with small jitter are to be generated.

An alternative to analog PLLs are digital PLL circuits that use a digitally controlled oscillator, or DCO. DCOs are often implemented by an oscillator providing a high frequency output signal and an N-divider. The N-divider divides the high frequency input clock, e.g. by means of one or more counters, into an output clock signal having a lower frequency. However, even designing and operating a digital PLL can be a challenging task if very high output frequencies are to be synthesized, because at least a factor of three between the input frequency and the divided frequency is typically required in order to provide sufficiently small steps for regulation, and for decoupling the high frequency clock and the buffered output clock derived from the high frequency clock. In particular in FPGAs (field programmable gate arrays), which typically use and provide lower clock frequencies than ASICs (application specific integrated circuits), it is often not possible to implement DCOs capable of providing the required high frequency.

Delay locked loop circuits, or DLLs, are an alternative to PLLs. A DLL takes a, e.g. locally generated, clock input and dynamically performs a phase shift using one or more selectable or adjustable delay elements for providing a desired delay time. A delay element can be for instance an inverter pair having a predetermined propagation delay. Modern DLLs are able to combine some of the delay elements dynamically, or are able to dynamically adjust the delay. DLLs of this kind are commercially available and described e.g. in the data sheet and user guide of the Xilinx Virtex-5 FPGA, available under http://www.xilinx.com/support/documentation/data_sheets/ds202.pdf, http://www.xilinx.com/support/documentation/user_guides/ug190.pdf.

Compared to PLLs a DLL is able to eliminate phase differences much faster. However, the maximum delay is ultimately limited, e.g. up to 256 basic delay steps using an 8-bit counter. This results in commercially available DLLs not being capable of balancing continuous frequency drifts, because this requires continuous phase balancing during run time. In other words, balancing a persistent frequency difference between two or more clocks requires an infinite number of delay elements. Shortly after the process starts, any commercially available DLL having a finite maximum delay would run into its limitation, due to the finite maximum phase shift it can provide, resulting in an output clock signal that cannot be shifted any more. If this occurs, the frequency synchronization will be lost, because the clock in a receiver has to permanently follow the transmitter clock frequency. For this reason, DLLs are often only used for setting an initial delay within a circuit, so as to compensate for a known delay inside the circuit that is generally not variable.

US 2009/0267665 A1 discloses a DLL circuit having two DLLs, one of which selectively provides an output signal through a multiplexer. The DLLs are fed with respective inverted clock signals, i.e. a clock signal having a phase offset of 180°. However, the known DLL circuit is used in a system, in which a single system clock is provided locally and concurrent with data that is processed using the system clock, and in which the delay does not vary, because it is caused by different physical path lengths of clock and data lines. In other words, the known circuit is used for compensating run time differences in clock and data signals within the same apparatus. The known DLL circuit switches over between the two DLLs only during initial set-up, in the case of the delay provided by the first DLL is insufficient, i.e. switching over between the two DLLs occurs only once. A single switchover is sufficient, because the physical path lengths are constant, and do not change during runtime. Also, a single switch over process occurring only during an initiation phase of a circuit greatly reduces the danger of glitches, or generally clock pulses not conforming to a required shape, duration, or the like, having a detrimental influence on the operation of a circuit.

SUMMARY OF THE INVENTION

It is desirable to provide a clock generation circuit that allows for matching a locally generated internal clock with an externally supplied clock, notably an externally supplied reference clock that is not supplied immediately, i.e. as proper clock signal, but is derived from data received.

The inventive clock generation circuit comprises an internal clock signal source providing an internal clock signal, e.g. a locally generated clock signal, and a synchronization device for synchronization the internal clock signal with a reference clock signal provided externally from the clock generation circuit. The synchronization device comprises n delay locked loop circuits, n being an integer greater than 1, wherein each delay locked loop circuit has a clock input for receiving the internal clock signal and a clock output for providing an output clock signal with an individual phase shift. The individual phase shift is adjustable in e.g. m basic phase shift steps. The synchronization device also comprises a clock multiplexer having n inputs and an output wherein each of the n inputs is connected to an output of one of the n delay locked loops and a control circuit. The control circuit is adapted to adjust at least one delay locked loop circuit according to the current phase shift between the internal clock signal and the reference clock signal and to select that input of the clock multiplexer that receives an output clock signal of the adjusted delay locked loop circuit that is synchronized, in frequency and phase with the reference clock signal, wherein the output of the clock multiplexer provides that output clock signal as synchronized clock signal and wherein the control circuit is adapted to toggle between the n delay locked loop circuits. Thereby, the control circuit is adapted in a way that the phase of the internal clock signal is successively shifted according to the current phase shift between the internal clock signal and the reference clock signal.

The inventive clock generation circuit provides the synchronization of an internal clock signal with an externally provided clock signal based on alternating selected delay locked loops, or DLLs. The inventive clock generation circuit uses two or more delay locked loops, or DLLs, one of which always provides an output clock signal which is locked on the reference clock signal in terms of phase and frequency.

In one embodiment of the invention, the reference clock signal is externally supplied to one or more phase comparators of the synchronization device of the clock generation circuit, enabling clock frequency synchronization, e.g. in a receiver. In another embodiment, the information about the current phase shift between the internal clock signal and the reference clock signal is derived from data received.

The control circuit alternatively or simultaneously adjusts the DLLs according to the current phase shift, wherein at least one DLL provides an output clock corresponding to the reference clock, i.e. at least one DLL is locked onto the reference signal. The output clock signal of the DLLs that is currently locked onto the reference signal is selected by the multiplexer and provides the synchronized clock signal to further circuitry.

The multiplexer and the DLLs are controlled by a control circuit, to which the comparators are connected or the data concerning the current phase shift are delivered and which may be implemented as a finite state machine, or FSM.

PLL circuits typically used for clock synchronization, and their components, including VCOs, can be substituted by simpler and less expensive DLLs, which are available as building blocks for example in standard FPGA libraries. By toggling between the DLLs, the inventive combination of two or more DLLs allows for continuously shifting the phase of a locally generated internal clock signal without exceeding the maximum delay of a single DLL.

Preferably, the control circuit is adapted to additionally adjust a next delay locked loop circuit according to the current phase shift before selecting that input of the clock multiplexer that receives the output clock signal of the next adjusted delay locked loop circuit.

In an embodiment of the invention, the synchronization device comprises at least two delay locked loop circuits which are adapted to provide output clock signals being in phase. The control circuit toggles between the DLLs at each time when the current phase shift corresponds to the time period of the internal clock or a multitude of the time period.

In a further embodiments of the invention, the synchronization devices comprises at least two delay locked loop circuits, wherein a first delay locked loop circuit is adapted to provide an output clock signal having a first phase shift with a minimum delay, including but not limited to no delay, and a p-th delay locked loop circuit, p being an integer greater than 1 and smaller or equal to n, is adapted to provide an output signal having a p-th phase shift with a minimum delay that is offset from the minimum delay of the first delay locked loop circuit by $[p-1]*360°/n$, or $[p-1]*2\pi/n$.

Preferably, the offset of the individual phase shift of a p-th delay locked loop circuits is obtained by accordingly delaying the internal clock signal. In one embodiment of the invention, the DLLs are adapted to internally delay the internal clock signal and to provide different adjustable output clock signals which are delayed to each other. In order to provide an output signal having a p-th phase shift with a minimum delay that is offset from the minimum delay of the first delay locked loop circuit, a different output clock signal of a p-th locked loop circuit is used.

Preferably, the maximum delay of the phase shift of each of the n delay locked loop circuits is equal or larger than $360°/n$ or $2\pi/n$.

In an embodiment of the invention, the synchronization device comprises two delay locked loops wherein the second delay locked loop circuit is adapted to provide an output signal having the second phase shift with a minimum delay that is offset from the minimum delay of the first delay locked loop circuit by 180°, or $\pi$. In particular, the two DLLs are complementary in phase, where their minimum delays have an offset of 180°, and preferably cover an overlapping phase range. Any time one DLL is about to run into its maximum delay, the other DLL, being close to its minimum delay, is selected. When the frequency difference persists and does not change its sign, the first DLL would take over as soon as the second DLL, which just took over, runs into its maximum delay. The control circuit continuously switches over between the two DLLs, i.e. it toggles between the two DLLs. Of course any higher number of DLLs can be used, the DLLs preferably having the same phase adjustment range and all DLLs having offsets distributed such that their combined phase adjustment range covers one complete cycle of the locally generated clock signal. A switchover occurs between two DLLs having the smallest phase offset to each other.

An offset of 180°, or IF of the phase shift of a delay locked loop circuit is preferably obtained by inverting the internal clock signal.

The control circuit is preferably implemented as a finite state machine.

In a simple exemplary embodiment of the invention, the synchronization device comprises two delay locked loops, or DLLs, the clock multiplexer, the control circuit implemented as a finite state machine FSM for controlling the DLLs and the multiplexer, and, if so, few logic cells and registers. Such elements are commercially available as building blocks in libraries for FPGAs or ASICs.

In one embodiment of the invention the internal clock signal is synchronized on the rising or the falling edge of the reference clock signal.

Removing the need for VCOs required by a PLL circuit represents an enormous cost reduction for various kinds of transmission systems, in which the receiver frequency must be synchronized with the transmitter frequency without the transmitter clock being directly transmitted along with the data and used for clocking the receiver. In other words, the invention is useful in all systems in which the receiver has its own, local clock generator, but at least parts of which must be synchronized with the clock of the transmitter. The fully digital solution provided by the invention allows for simple and flexible adaptation to different environmental conditions.

A basic embodiment using only two DLLs, as described below, allows for balancing of small frequency or phase drifts of a clock with regard to a reference clock by continuously shifting its clock phase. Hence, one preferred application of the inventive clock generator is regenerating a transmitter's clock in a receiver, used in all kinds of transmission systems, which today often are equipped with VCOs and PLLs.

BRIEF DESCRIPTION OF THE DRAWINGS

The invention will be explained in more detail using embodiments, shown and explained in the figures.

In the figures.

EMBODIMENTS OF THE INVENTION

Figure 2A:
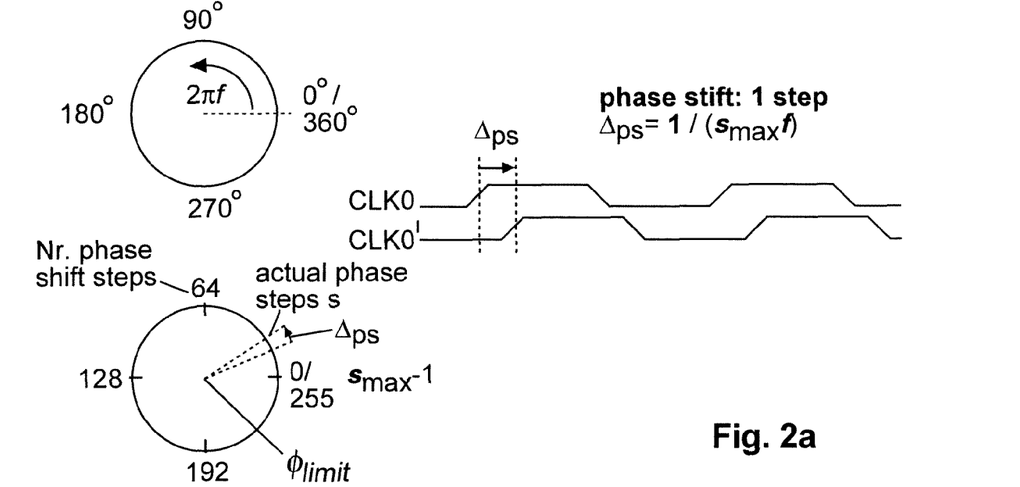
FIG. 2a shows details concerning DLL phase shift.

FIG. 2a depicts circle diagrams and a timing diagram which show details concerning phase shift of delayed locked loop circuits, or DLLs in general. Such DLLs are provided for a synchronization device of a clock generation circuit according to the invention.

Generally, in a DLL a basic phase shift step, or a phase step size $\Delta_{ps}$, depends on the internal clock frequency f that is generated locally and to be shifted, and on the maximum number of phase shift steps $S_{max}$ that are provided by the DLL, assuming equal distribution of the phase shift steps across one complete cycle or time period of the local clock signal:

$$\Delta ps = 1/(S_{max} * f) \quad (1)$$

A typical counter used in a DLL has a specific bit width b. In that case $S_{max}$ becomes $S_{max}=2^b$. Assume, for example, a maximum phase shift of 360°, or $2\pi$ is desired, the counter of the DLL has a bit width of 8 where $S_{max}=2^8=256$, and the internal clock of the DLL has a frequency f of 120 MHz. In that case, if the maximum counting capacity of the counter is used, the smallest possible phase shift step would be $\Delta_{ps}=32.5$ ps ($\Delta_{ps}=1/[256*120$ MHz$]$). An adjustable phase shift would be $s*\Delta_{ps}$, where s is the number of phase shift steps.

However, the achievable phase shift $\Delta\phi$ may be limited to a smaller value $\phi_{limit}$. If the internal clock frequency f is in a specific frequency range depending of the DLL that is actually used, the achievable phase shift $\Delta\phi$ corresponds to 360°, i.e. an achievable phase shift $\Delta\phi=S_{max}*\Delta_{ps}=256*\Delta_{ps}$ is possible for this DLL. If the internal clock frequency f is lower than the lowest frequency of the frequency range of the DLL, the achievable phase shift $\Delta\phi$ is limited to a smaller value $\phi_{limit}$. In this case the periodic time of the internal clock signal is higher then the maximal delay time of the DLL. Only a lower number N of the phase shift steps $\Delta ps=1/(S_{max}*f)$ are achievable: $\phi_{limit}=S_{limit}*\Delta_{ps}=N*\Delta_{ps}$. The used DLL with the given bit width of its counter—which often even has maximum counting capacities smaller than 256—only allows for a maximum phase shift smaller than 360°, or $2\pi$. This situation is shown in FIG. 2a.

The upper circle of FIG. 2a generally depicts the phase of an oscillation represented as angles of a circle. The lower circle depicts the same circle as above but is divided into a maximum number of phase shift steps $S_{max}$ equally distributed over the circle. For the sake of clarity, only the respective steps s corresponding to 0, 90, 180, 270 and 360 degrees, 0, 64, 128, 192 and 256 are shown. $\Delta_{ps}$ indicates the minimum angle corresponding to the minimum step size. An exemplary current phase step s corresponding to a phase shift $s*\Delta_{ps}$ is also shown. The dashed line labeled $\phi_{limit}$ indicates an example where the maximum phase shift that can be achieved in case the internal frequency is too low for the specific DLL. The timing diagram to the right of the two circles schematically shows the effect of the phase shift in the time domain. Clock CLK0 is an input clock, and clock CLK0' is an output clock that is phase-shifted by one phase shift step $\Delta_{ps}$.

If a continuous phase shift is required, e.g. in the case of the internal clock does not exactly have the same frequency as the reference clock to which it is to be synchronized, a DLL must never run into its limitation $\phi_{limit}$ which corresponds to a limited number of steps s lower than the maximum number of steps $S_{max}$. In accordance with the invention reaching the limitation is prevented by regularly switching over between two or more DLLs, which are phase-shifted with regard to each other. The basic principle is shown in FIG. 2b.

Figure 2B:
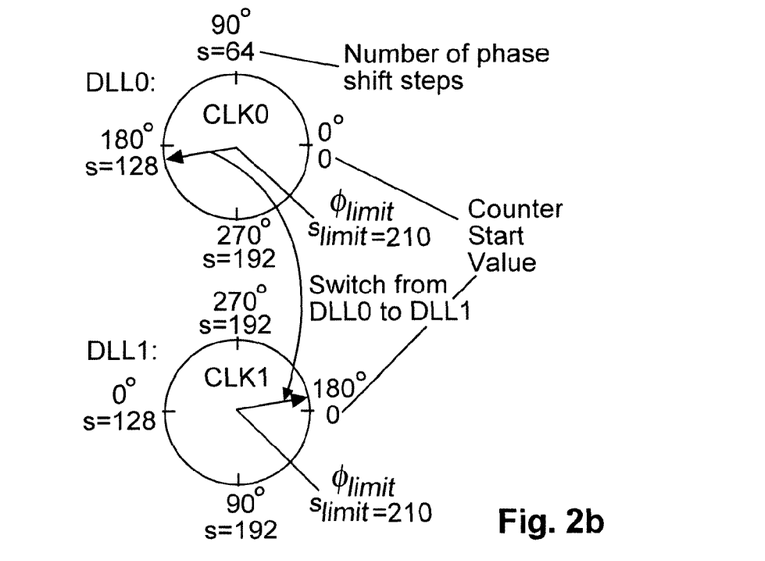
FIG. 2b shows switching between the two DLLs of one embodiment of the invention.

FIG. 2b shows the phase diagrams of two DLLs in a circle diagram, in which the angle of the arrow indicates the phase shift. In this example of the invention, both DLLs are fed with internal clock signals CLK0, CLK1, respectively, having the same frequency, but opposite phase. $S_{max}$ of the DLLs is 256, like in the examples described further above. The upper circle, representing the phase relationship of DLL0, shows that a maximum delay $\phi_{limit}$ is reached at approximately 315° corresponding to a number $S_{limit}$ of 210 phase shift steps $\Delta_{ps}$, i.e. a complete 360° phase shift cannot be achieved using only DLL0. However, DLL1 is fed with an inverted internal clock signal CLK1, i.e. even at a delay set to 0 the output signal of DLL1 is actually phase-shifted by 180°. With that, the minimum delay of the second DLL1 is offset from the minimum delay of the first DLL0 by 180°. Whenever DLL0 exceeds a phase shift of 180° it has, in the exemplary example shown in FIG. 2b, already exceeded half of the counter's maximum counting value, i.e. has counted to 128. However, DLL1 has only begun counting, while already providing a phase shift of 180°. So, at any time after DLL0 exceeds a phase shift that corresponds to the minimum phase shift, which can be provided by DLL1, and before reaching $\phi_{limit}$, a switchover, indicated with an arrow, from DLL0 to DLL1 can be performed without interrupting the desired continuous phase shifting process.

Depending on the maximum phase shift $\phi_{limit}$ that can be obtained by a single DLL the number n of DLLs required for continuous phase shifting can be determined as $$n = \text{integer}(360°/\phi_{limit}) + 1 \quad (2)$$

assuming identical DLLs. At any time only one of the n DLL clock outputs represents the clock output of the overall circuit. As shown in the exemplary embodiment above, where two DLLs are used, the phase offset between the two DLLs is 180°. This can easily be obtained by inverting the signal that resets and/or triggers the DLL or its counter, or by adding a fixed delay of 180° to the internal clock signal fed to the DLL. In case of n DLLs the phase offset between the DLLs is 360°/n or a multiple thereof, depending on the position of the DLL in the switching sequence.

As stated above, at any time only one DLL provides the locked output signal to circuitry connected downstream. The selection of the respective DLL output is performed by a sophisticated asynchronous or synchronous clock multiplexer. The clock multiplexer must switch over between the clock outputs of a currently selected DLL and the DLL to be selected next without any disruption, or glitch. That is, before the clock can be switched over the phase shift steps of the two DLLs between which a switchover will be done must be "in phase" or in a specific phase relationship.

In an embodiment of the invention this control is also performed by the control circuit, which is adapted to adjust a next delay locked loop circuit according to the current phase shift before selecting its input of the multiplexer. In particular, the control circuit is generated as a finite state machine, or FSM, which controls the exact time when the clock multiplexer switches over in order to prevent undesired glitches at the clock output of the clock generation circuit.

The invention will be further explained using the embodiments shown in FIGS. 3a to 3d and 4.

In one embodiment, a clock generation circuit comprises an internal clock signal source providing an internal clock signal CLK_INT and a synchronization device for synchronization the internal clock signal CLK_INT with a reference clock signal CLK_REF provided externally from the clock generation circuit. The synchronization device comprises n delay locked loop circuits Sync_DLL_0, Sync_DLL_1, Sync_DLL_2, Sync_DLL_3, n being an integer greater than 1, each delay locked loop circuit Sync_DLL_0, Sync_DLL_1, Sync_DLL_2, Sync_DLL_3 having a clock input for receiving the internal clock signal CLK_INT and a clock output for providing an output clock signal CLK(0), CLK(1), CLK(2), CLK(3) with an individual phase shift that is adjustable. The synchronization device further comprises a multiplexer CLK-MUX having n inputs and an output wherein each of the n inputs is connected to an output of one of the n delay locked loops Sync_DLL_0, Sync_DLL_1, Sync_DLL_2, Sync_DLL_3 and a control circuit. The control circuit is adapted to adjust at least one of the delay locked loop circuits Sync_DLL_0, Sync_DLL_1, Sync_DLL_2, Sync_DLL_3 for providing an individual phase shift according to a current phase shift and to select that input of the multiplexer CLK-MUX that receives an output clock signal CLK(0), CLK(1), CLK(2), CLK(3) of the adjusted delay locked loop circuit Sync_DLL_0, Sync_DLL_1, Sync_DLL_2, Sync_DLL_3 that is synchronized in frequency and phase with the reference clock signal CLK_REF, wherein the output of the multiplexer CLKMUX provides that output clock signal as synchronized clock signal CLK_SYNC. Thereby the control circuit is adapted to toggle between the n delay locked loop circuits Sync_DLL_0, Sync_DLL_1, Sync_DLL_2, Sync_DLL_3, in a way that the phase of the internal clock signal CLK_INT is successively shifted according to the current phase shift between the internal clock signal CLK_INT and the reference clock signal CLK_REF. The reference clock signal CLK_REF and the control circuit FSM are only shown in FIG. 4.

FIGS. 3a to 3d show four embodiments of the invention, wherein each synchronization device comprises at least two DLLs Sync_DLL_0, Sync_DLL_1, Sync _DLL_2, Sync_DLL_3 which are adapted to internally delay the internal clock CLK_INT, and to provide adjustable and selectable output clock signals CLK_0°, CLK_90°, CLK_180° and CLK_270° of which minimum delays are phase-shifted, especially by 90°, to each other. The selected output clock signal CLK(0), CLK(1), CLK(2) and CLK(3) of each DLL is connected to the corresponding input of a clock multiplexer CLKMUX. Each of the FIGS. 3a to 3d is provided with a circle diagram which depicts the number of achievable phase shift steps $S_{limit}$.

Figure 3A:
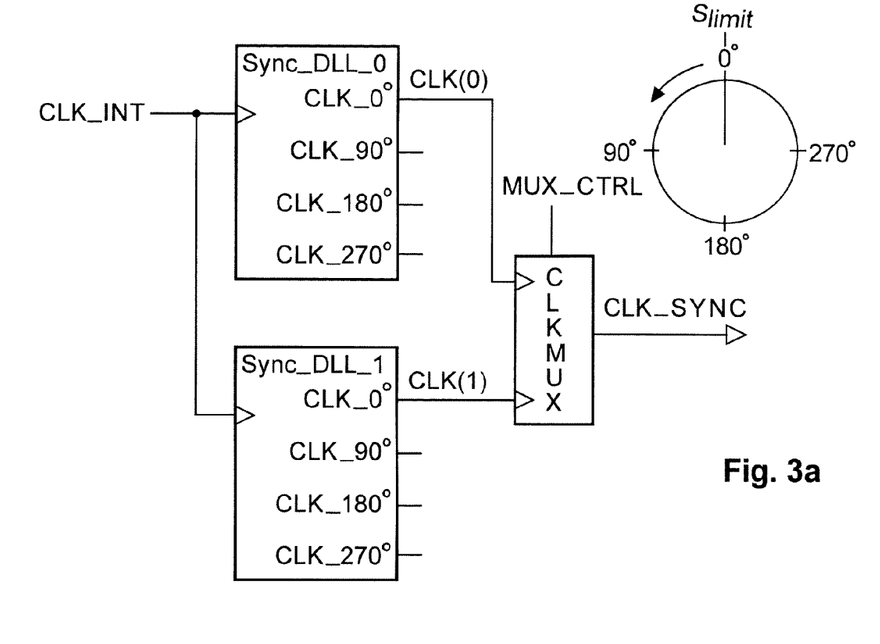
FIG. 3a shows two DLLs of one embodiment of the invention.

The synchronization device shown in FIG. 3a comprises two delay locked loop circuits, or DLLs, Sync_DLL_0 and Sync_DLL_1, which are adapted to provide output clock signals CLK(0) and CLK(1), being in phase. For each DLL, the first selectable output clock signal CLK_0° is selected as the output clock signal CLK(0) and CLK(1) respectively. The control circuit FSM (not shown) toggles between the DLLs at each time when the current phase shift corresponds to the time period of the internal clock or a multitude of the time period. The number of achievable phase shift steps $S_{limit}$ corresponds to the maximum number of phase shift steps $S_{max}$, enabling a phase shift of 360°.

Figure 3B:
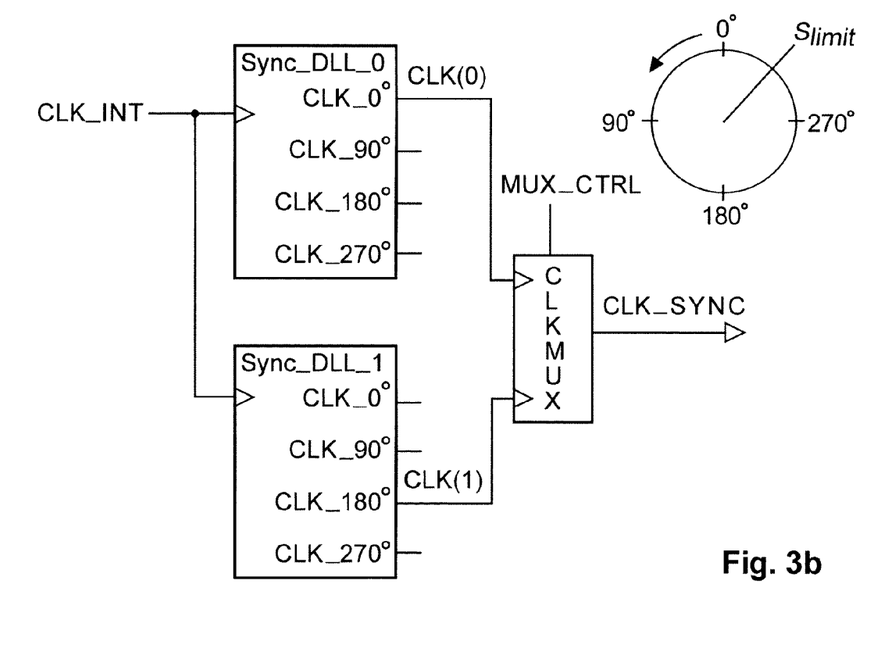
FIG. 3b shows two DLLs of one embodiment of the invention.
Figure 3C:
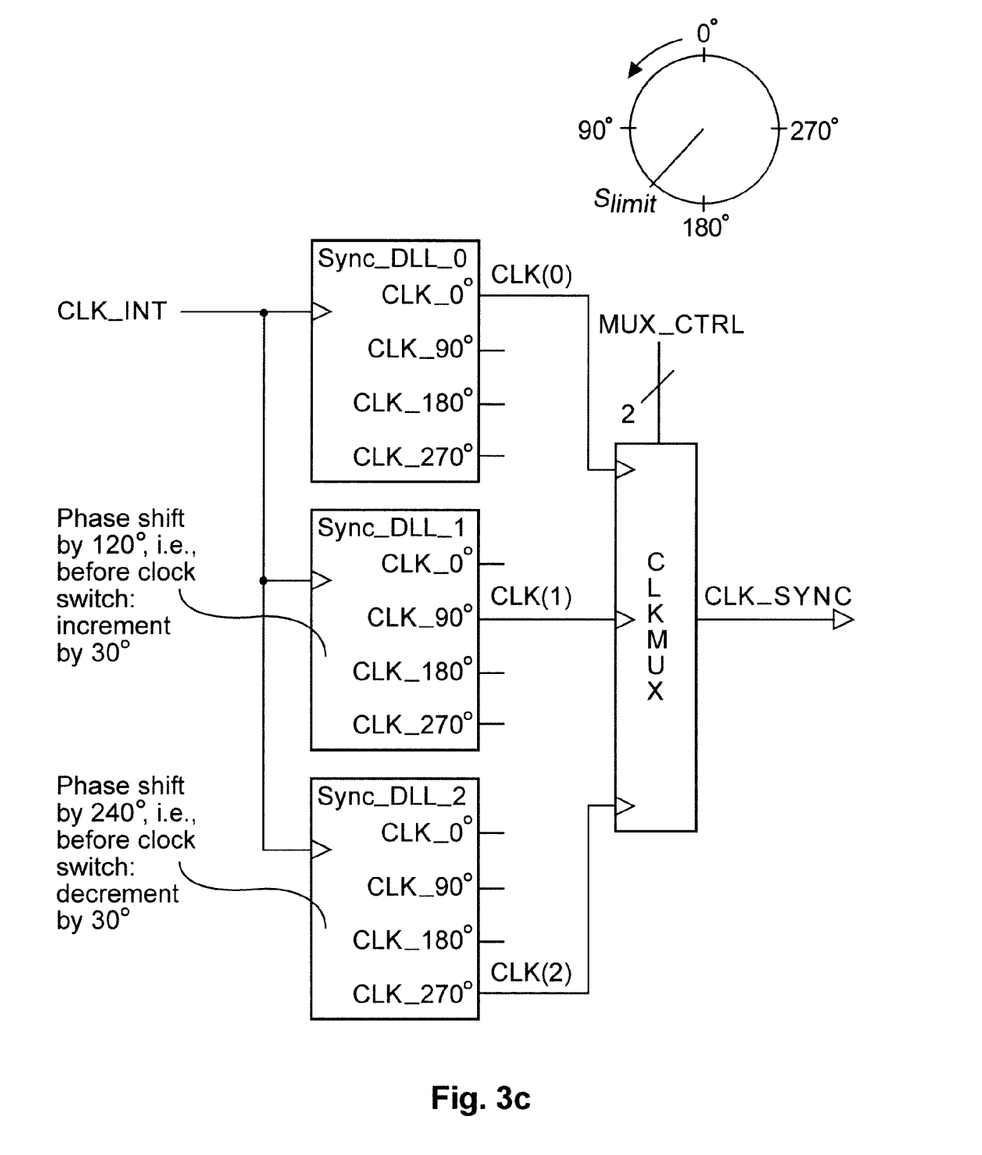
FIG. 3c shows three DLLs of one embodiment of the invention.
Figure 3D:
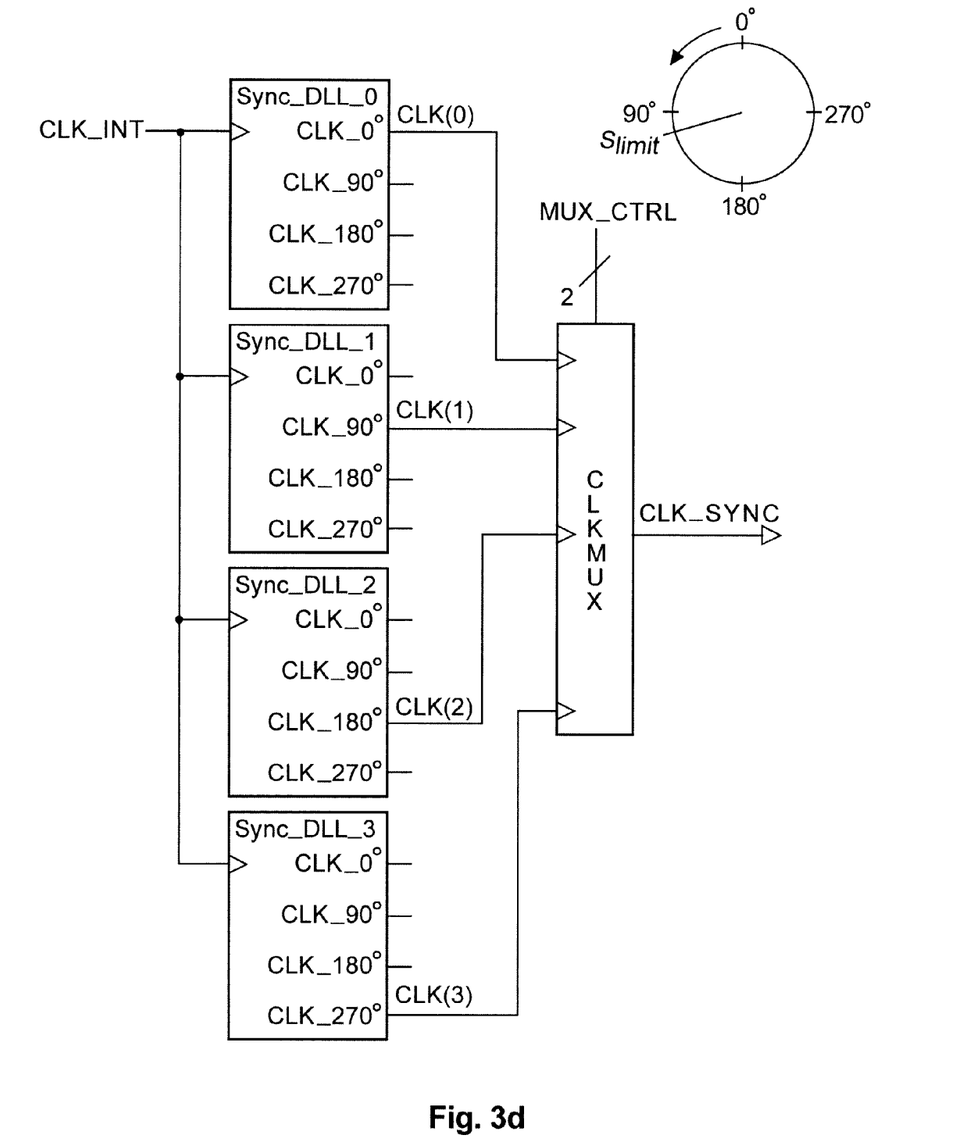
FIG. 3d shows four DLLs of one embodiment of the invention.

The embodiments shown in FIGS. 3b to 3d are examples for providing continuous phase shifting in case of a maximum phase shift $\phi_{limit}$ that can be obtained by a single PLL.

In one embodiment, the synchronization device comprises at least two delay locked loop circuits Sync_DLL_0, Sync_DLL_1, Sync_DLL_2, Sync_DLL_3. A first delay locked loop circuit Sync_DLL_0 is adapted to provide an output clock signal CLK(0) having a first phase shift with a minimum delay, including but not limited to no delay. A p-th delay locked loop circuit Sync_DLL_1, Sync_DLL_2, Sync_DLL_3, p being an integer greater than 1 and smaller or equal to n, is adapted to provide an output signal CLK(p) having a p-th phase shift with a minimum delay that is offset from the minimum delay of the first delay locked loop circuit Sync_DLL_0 by [p−1]*360°/n, or [p−1]*2π/n.

The synchronization device shown in FIG. 3b comprises two delay locked loop circuits, or DLLs, Sync_DLL_0 and Sync_DLL_1, wherein the second delay locked loop circuit Sync_DLL_1 is adapted to provide an output signal CLK(1) having the second phase shift with a minimum delay that is offset from the minimum delay of the output signal CLK(0) of the first delay locked loop circuit Sync_DLL_0 by 180°, or π.

Thereto, the first selectable output clock signal CLK_0° is selected as the output clock signal CLK(0) of the first DLL Sync_DLL_0 and the third selectable output clock signal CLK_180° having a phase-shift by 180° is selected as the output clock signal CLK(1) of the second DLL Sync_DLL_1. The number of achievable phase shift steps $S_{limit}$ of each DLL is smaller than the maximum number of phase shift steps $S_{max}$.

The synchronization device shown in FIG. 3c comprises three delay locked loop circuits, or DLLs, Sync_DLL_0, Sync_DLL_1 and Sync_DLL_2, wherein the second delay locked loop circuit Sync_DLL_1 is adapted to provide an output signal CLK(1) having the second phase shift with a minimum delay that is offset from the minimum delay of the output signal CLK(0) of the first delay locked loop circuit Sync_DLL_0 by 120° and, the third delay locked loop circuit Sync_DLL_2 is adapted to provide an output signal CLK(2) having the third phase shift with a minimum delay that is offset from the minimum delay of the output signal CLK(0) of the first delay locked loop circuit Sync_DLL_0 by 240°. Thereto, the first selectable output clock signal CLK_0° is selected as the output clock signal CLK(0) of the first DLL Sync_DLL_0. The second selectable output clock signal CLK_90° having a phase-shift by 90° and an predetermined incremental phase-shift by 30° is selected as the output clock signal CLK(1) of the second DLL Sync_DLL_1. The third selectable output clock signal CLK_270° having a phase-shift by 270° and an predetermined decremented phase-shift by 30° is selected as the output clock signal CLK(2) of the third DLL Sync_DLL_2. The number of achievable phase shift steps $S_{limit}$ of each DLL is smaller than the maximum number of phase shift steps $S_{max}$.

The synchronization device shown in FIG. 3d comprises four delay locked loop circuits, or DLLs, Sync_DLL_0, Sync_DLL_1, Sync_DLL_2 and Sync_DLL_3, wherein the second, third and fourth delay locked loop circuits Sync_DLL_1, Sync_DLL_2 and Sync_DLL_3 are adapted to provide output signal CLK(1), CLK(2) and CLK(3) having the second, third and fourth individual phase shifts with minimum delays that are offset from the minimum delay of the output signal CLK(0) of the first delay locked loop circuit Sync_DLL_0 by 90°, 180° and 270°. Thereto, the first selectable output clock signal CLK_0° is selected as the output clock signal CLK(0) of the first DLL Sync_DLL_0, the second selectable output clock signal CLK_90° is selected as the output clock signal CLK(1) of the second DLL Sync_DLL_1, the third selectable output clock signal CLK_180° is selected as the output clock signal CLK(2) of the third DLL Sync_DLL_2 and the fourth selectable output clock signal CLK_270° is selected as the output clock signal CLK(3) of the fourth DLL Sync_DLL_3. The number of achievable phase shift steps $S_{limit}$ of each DLL is smaller than the maximum number of phase shift steps $S_{max}$.

Figure 4:
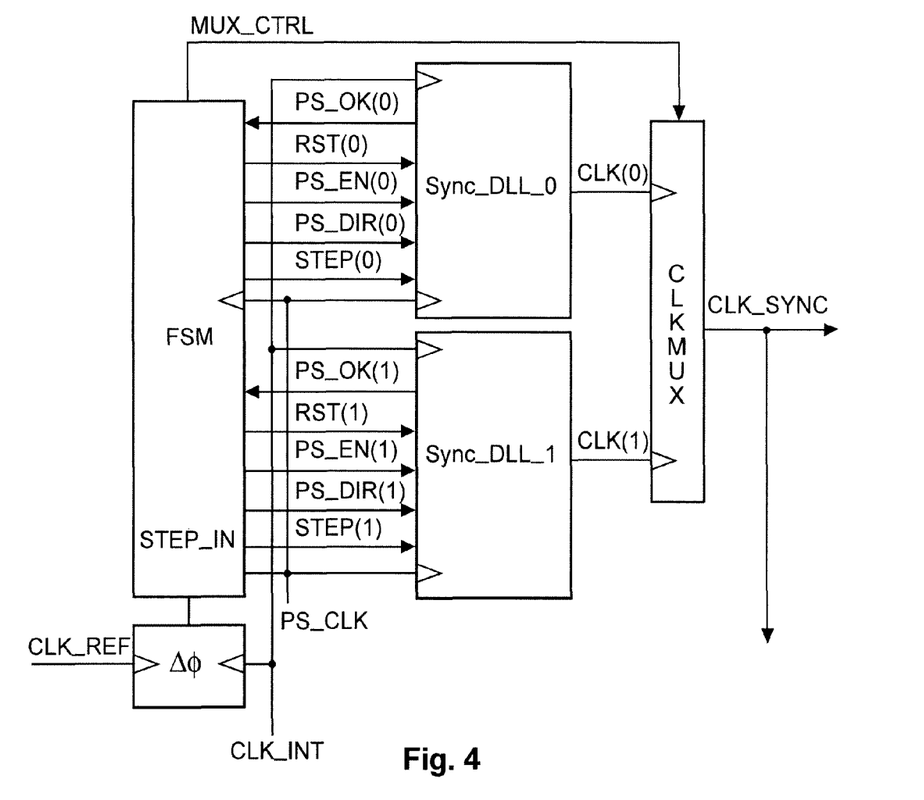
FIG. 4 shows a block diagram of the synchronization device of the embodiment of the invention.

FIG. 4 exemplarily shows how two DLLs SYNC_DLL_0, SYNC_DLL_1, the general operation of which was described in FIG. 3b, are connected in a clock generation circuit, in particular in a synchronization device of it, in accordance with the invention. The synchronization device further comprises a clock multiplexer CLKMUX, a control circuit FSM and a comparator Δϕ.

As stated before, actual clock generation circuits may comprise a higher number of DLLs and consequently a larger number of connections between the DLLs and the control circuit.

A locally generated internal clock signal CLK_INT is supplied to corresponding inputs of the first DLL SYNC_DLL_0 and the second DLL SYNC_DLL_1. A phase shift of 180° is applied to the internal clock signal CLK_INT inside the second DLL SYNC_DLL_1, e.g. by internally inverting the internal clock signal.

It is noted that any required phase shift of the reference clock signal CLK_REF may also be introduced by external components upstream of the respective clock input of a DLL. Any additional phase shift introduced must be taken into account when adjusting the phase shift of the respective DLL.

An operating clock PS_CLK running at a basic clock frequency is supplied to both DLLs, SYN_DLL_O and SYN_DLL_1. Output clock signals CLK(0) and CLK(1) of the two DLLs are fed to respective inputs of the clock multiplexer CLKMUX, while the output of which provides a synchronized clock signal CLK_SYNC being synchronized in terms of frequency and phase with the reference clock signal CLK_REF.

The reference clock signal CLK_REF is supplied to a first input of the phase comparator Δϕ, and the internal clock signal CLK_INT is supplied to a second input of phase comparator Δϕ. The phase comparator Δϕ which is connected with the control circuit FSM provides information about the phase difference between the reference clock signal CLK_REF and the internal clock signal CLK_INT.

During operation, the control circuit FSM adjusts the phase shift of a selected one of the DLLs in such a way that the output signal CLK_SYNC is in synchronism with the reference clock signal CLK_REF.

In the exemplary embodiment of the invention shown in FIG. 4, the phase adjustment is controlled by the control circuit FSM. The phase adjustment is performed by accordingly setting a predetermined value STEP(0), STEP(1) of the DLL's counters, up to which the counters count prior to forwarding state changes of the locally generated internal clock CLK_INT to the respective DLL's output CLK(0), CLK(1). The predetermined value STEP(0), STEP(1) supplied to the DLL's are determined from the phase difference of the phase comparator Δϕ and from a value STEP_IN which is a number of phase shift steps for the corresponding phase shift. When the counter has counted to the predetermined value STEP(0), STEP(1), it is reset by the values RST(0), RST(1) and waits for the next trigger to begin counting again. The counting direction is set by values PS_DIR(0), PS_DIR(1). The phase adjustment is enabled by values PS_EN(0), PS_EN(1) of set inputs. It is likewise possible to count down to zero from a predetermined value, depending on the implementation of the counter.

In one embodiment of the invention, a pulse at the DLL's set input PS_EN(0), PS_EN(1) increases or decreases the predetermined count value only by one, depending on the signal at a corresponding input PS_DIR(0), PS_DIR(1). A reset signal at the DLL's reset input RST(0), RST(1) resets the predetermined count value to an initial value.

In one embodiment of the invention and also in the exemplary embodiment shown in FIG. 4, whenever the phase shift of any of the DLLs has been changed and the synchronized clock signal CLK_SYNC has been phase-shifted accordingly, the respective DLL issues a signal PS_OK(0), PS_OK(1) to control circuit FSM. Only then a further change of the phase shift is effected, if necessary. This reduces jitter possibly introduced by the counting process in the control loop.

In the exemplary embodiment of FIG. 4 the control circuit FSM is implemented in the form of a finite state machine.

The number of steps STEP_IN required for achieving substantially zero phase difference between the internal clock signal CLK_INT and the reference clock signal CLK_REF depends on the application.

Increasing or decreasing the phase shift and resetting of the DLLs may be controlled individually, or simultaneously, depending on the implementation and the requirements of the application.

The counters of the DLLs in accordance with the invention may simply trigger a counting process beginning at 0 and ending at a preset value STEP(0), STEP(1), or vice versa, with each change of the logic level at the input STEP_IN representing the difference between the internal clock signal CLK_INT and the reference clock signal CLK_REF. The respective change in the input signal STEP_IN will be reproduced at the DLL counter's output each time the counting process has reached the preset value STEP(0), STEP(1). In case the input signal STEP_IN has a duty cycle other than 50%, two counters may be provided, one for each direction of level change, i.e. one for a change high to low, or 1 to 0, and one for a change low to high, or 0 to 1.

Further, individually enabling or disabling of the DLLs may be envisaged in case switching over between the two DLLs does not occur very often. In that case, a currently not selected DLL may be inactivated for reducing energy consumption. Of course the DLL must be enabled and ready for operation prior to the next switchover.

Figure 5:
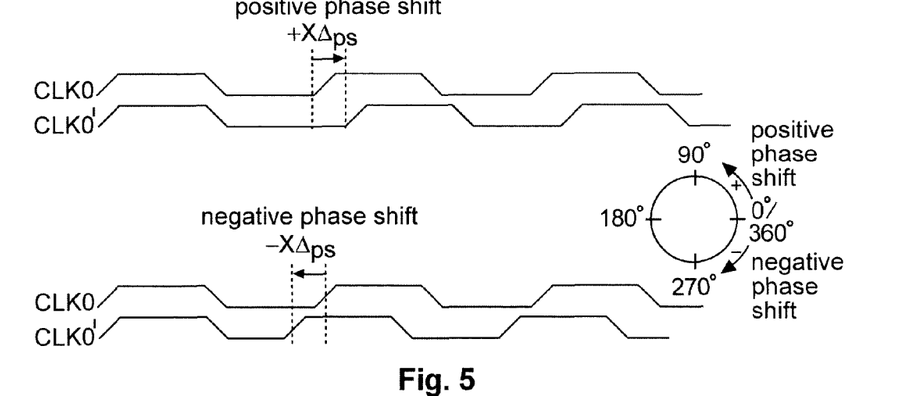
FIG. 5 shows details concerning a basic phase shift step.

As the phase between the locally generated, i.e. the internal clock signal CLK_INT and the reference clock signal CLK_REF is a relative phase, phase shifting can be done in both directions. FIG. 5 shows the principle of phase shifting of a clock by x steps: x*Δps. A positive shift by an angle between 0° and 360° is indicated by the angle increasing counterclockwise, and a negative shift is indicated by the angle increasing clockwise, respectively. The timing diagrams on the left of FIG. 5 indicate the respective shift through the positions of the rising slope of CLK0' versus CLK0. In case of a positive phase shift, the average frequency is temporarily decreased, whereas a negative phase shift temporarily increases the average frequency.

The phase difference between the locally generated internal clock signal CLK_INT and the reference clock signal CLK_REF can be determined, e.g. by counting clock cycles for a predefined time period. If the number of clock cycles of the locally generated clock signal CLK_INT is smaller than the number of clock cycles of the reference clock signal CLK_REF, then the frequency of the locally generated clock signal is lower than that of the reference clock signal CLK_REF. This must be compensated for by a negative phase shift, corresponding to a reduction of the cycle length of the locally generated clock signal CLK_INT. If the number of clock cycles of the locally generated clock signal CLK_INT is higher than the number of clock cycles of the reference clock signal CLK_REF, then the frequency of the locally generated clock signal is higher than that of the reference clock signal CLK_REF. This must be compensated for by a positive phase shift, corresponding to an increase of the cycle length of the locally generated clock signal CLK_INT. If the numbers of clock cycles are equal, the frequencies are the same and no phase shift needs to be performed.

The number n of DLLs determines the number of clock multiplexer inputs. The exemplary clock multiplexer CLK-MUX shown in FIG. 4 has two inputs, CLK(0) and CLK(1). The clock multiplexer performs switching from clock CLK(0) to CLK(1) or vice versa in response to control signal MUX_CTRL. It is generated by control circuit FSM.

In order to avoid a corrupt clock output both clocks must have the same logical level immediately before switching, preferably be substantially in specific phase with each other, e.g, CLK(0) have to be behind CLK(1) or vice versa. A corresponding control flow diagram is provided in FIG. 6.

The invention has been described above with reference to an exemplary, non-limiting embodiment. Various implementations of the invention are possible, including a circuit having two or more DLLs, each of which capable of autonomously providing phase and frequency lock up to a certain phase. Whenever any of these DLLs approaches an upper or lower phase shift limit it may trigger a signal to a control circuit, which then determines which further DLL of the circuit can be selected next in order to ensure continuous phase lock. All DLLs in such a circuit preferably provide a lock signal that can be used for indicating that a switchover between any two DLLs issuing the lock signal at the same time can be effected without losing lock.

Figure 6:
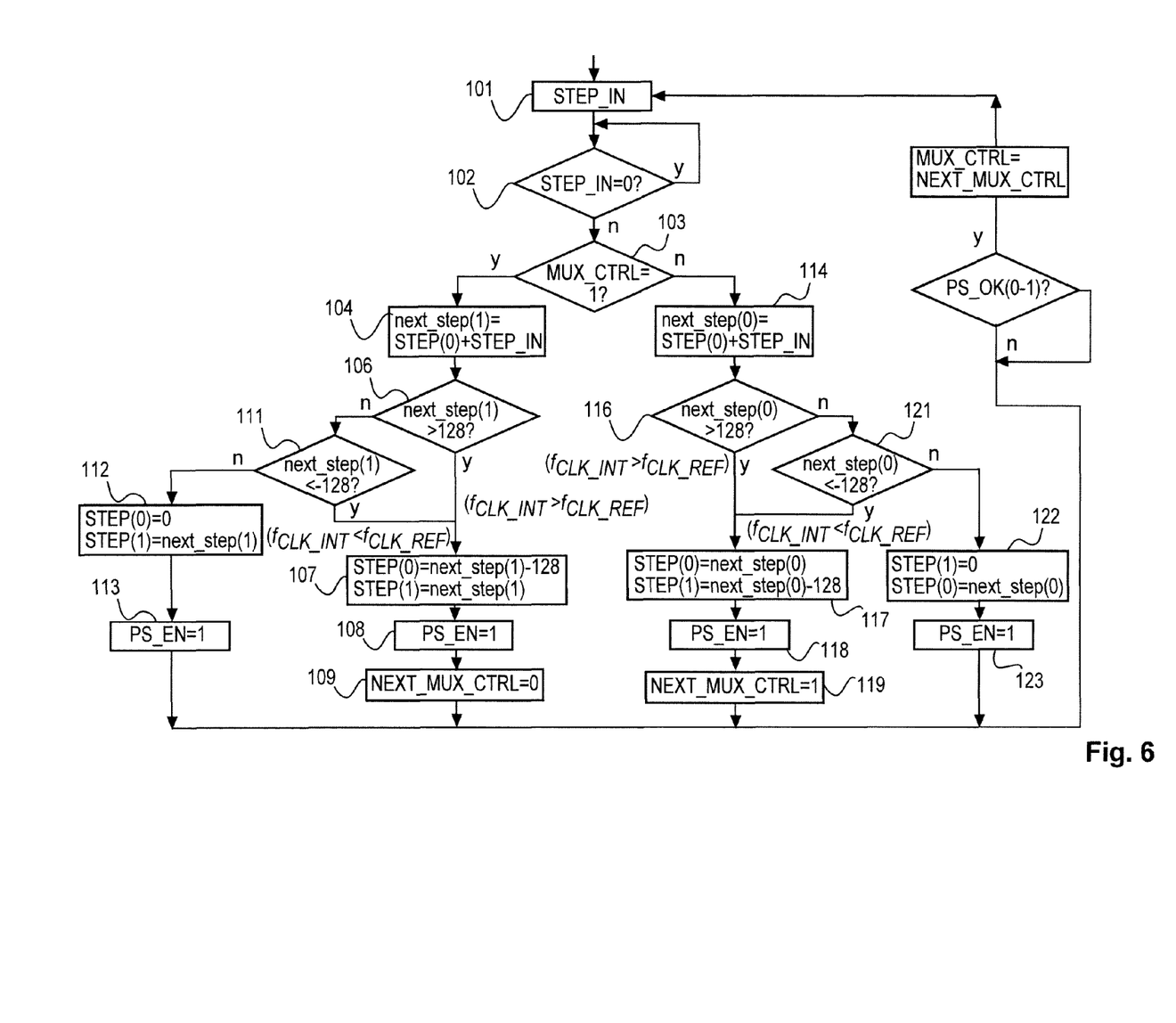
FIG. 6 shows a flow sheet concerning the switching between the two DLLs.

The operation of the inventive clock generation circuit will be exemplarily described in the following with reference to the flow chart shown in FIG. 6. It is assumed that n=2 and $S_{limit}$>128 steps, 128 steps corresponding to 180° just like in the example used further above. One DLL must have a basic phase offset of 0 and the other one a basic phase shift offset of 128 steps.

In step 101 a number of basic phase steps $\Delta_{ps}$ mentioned as STEP_IN corresponding to a difference $\Delta\phi$ between the phase and/or frequency of the locally generated clock and a reference clock is determined. In step 102 it is determined if the difference is larger or smaller than 0. If the phase difference is 0 determination step 101 is repeated. If the phase difference is larger or smaller than 0, step 103 determines which of the DLLs is currently selected. It is assumed that MUX_CTRL=0 indicates that DLL(0) is selected and MUX_CTRL=1 indicates that DLL(1) is currently selected. In case MUX_CTRL=1, the process branches to step 104, in which the phase difference previously determined is added to current phase shift indicated by value STEP(1), thereby obtaining the next phase shift value next_step(1) for DLL(1). In step 106 the next phase shift value next_step(1) is compared to an upper threshold value indicating that a switchover to another DLL may take place without losing synchronization. In the present exemplary embodiment, the phase shift of a DLL may be increased or decreased by one or more steps as long as its absolute phase shift is below 128 steps. In case the absolute phase shift is equal or higher, but still below $S_{limit}$, the other DLL should be selected by the multiplexer. However, before this can be done the output phases of the two DLLs must be substantially in phase with each other for ensuring glitch-free switchover. If step 106 determines that the phase shift is still below the threshold value, the process branches to step 111, where the next phase shift value next_step(1) is compared to a lower threshold value. If the upper or lower threshold is exceeded in any of steps 106 or 111 the phase shift of DLL(1) is adjusted to the phase shift value next_step(1) previously determined, and the phase shift value of DLL(0) is adjusted to the phase shift value next_step(1) minus the threshold value, in step 107. Then, in step 108, the new phase shift values are enabled in the DLLs. Step 109 indicates the switchover to the other DLL. If the upper or lower threshold is not exceeded in either of steps 106 or 111, the phase shift STEP(0) of DLL(0) is set to 0, and the phase shift STEP(1) of DLL(1) is set to the phase shift value next_step(1) previously determined, in step 112, and the adjustment is enabled in step 113. For the sake of clarity, both DLLs of the exemplary embodiment receive the same enabling signal, which may as well be an individual signal for each DLL. The same process as described hereinbefore is performed mutatis mutandis in the right half of the flow chart, with the respective variables labeled accordingly.

When the threshold is reached and both DLLs are substantially in phase the clock multiplexer can select the other DLL, i.e. perform a switchover. Typically, the control signals from the control circuit FSM are synchronous to a clock domain different from the reference clock signal. For avoiding possible clock domain crossing, the switchover signal MUX_CTRL must be synchronized into the correct clock domain of the DLL output clock signals before the multiplexer actually switches over. This allows for using asynchronous clock multiplexers.

In the foregoing the circuit and method has been described for n=2 DLLs. If more than two DLLs are used, the process of clock switching must be performed between those two DLLs having the smallest phase offset with regard to each other.

Figure 7:
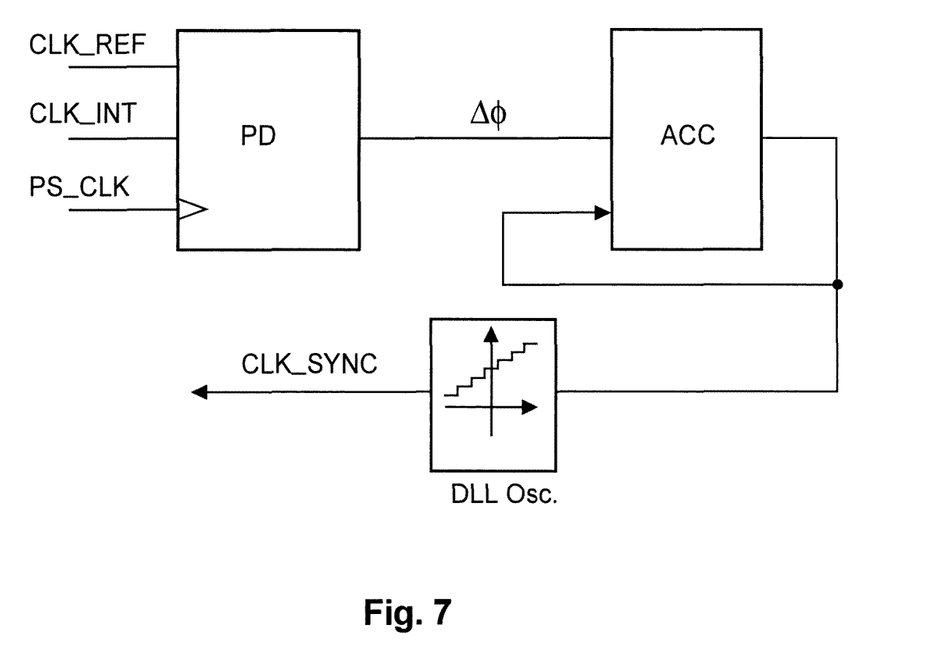
FIG. 7 shows block diagram with a synchronization device.

Finally, FIG. 7 provides an example how a known clock generation circuit using a PLL with open feedback can be substituted by the inventive clock generation circuit using DLLs. The function of the loop filter required in the known circuit is performed by an accumulator ACC which determines the phase difference $\Delta\phi$ coming from a phase detector PD over a fixed period of time.

The invention avoids having to use expensive controllable VCOs, leading to an enormous cost reduction for different kind of transmission systems, where the receiver frequency has to be synchronized onto the transmission frequency. The invention can be cost-effectively implemented into standard FPGAs, because they are already equipped with the needed elements, i.e., no extra elements are necessary.

The invention advantageously provides a pure digital solution, which is easy to adapt to different environmental influences.

In one embodiment of the invention, the duty cycle of the synchronized clock signal output by the clock multiplexer is exactly 50%, or very close to that value. This can be achieved by accordingly adjusting the delay of the DLL that is selected next, i.e. bringing the DLL that is selected next into substantial synchronism with the currently selected DLL, and by switching over between the output signals of the current DLL and the DLL to be selected next prior to a next falling or rising edge at either of the two signals. This ensures that the signal levels of the two DLLs are the same, i.e. both are either high or low, thereby avoiding glitches that otherwise may be caused by switching over between the two DLLs at a point in which one of the DLLs would change its signal level. Thereby, the internal clock signal CLK_INT is synchronized on the rising or the falling edge of the reference clock signal CLK_REF.

The invention claimed is:

1. A method of operating a clock signal generator circuit including at least a first and a second delay locked loop circuit, to respective inputs of which a locally generated clock signal is provided, each of the at least first and second delay locked loop circuits providing an output signal that is phase-shifted with respect to its input signal, the outputs of the at least first and second delay locked loop circuits being provided to respective inputs of a multiplexer, which multiplexer provides, as a synchronized clock signal, one of the output signals of the at least first and second delay locked loop circuits at its output in accordance with the output signal of a phase comparator in cooperation with a control circuit, each one of the at least first and second delay locked loop circuits providing a portion of a total phase shift of the circuit, wherein the portions of phase shift are arranged to cover adjacent or overlapping phase shift ranges that add up to a total phase shift range of at least 360 degrees phase shift, the method including:

receiving, at the phase comparator, a reference clock signal and the locally generated clock signal, controlling, in accordance with an output signal from the phase comparator in cooperation with the control circuit, a first one of the at least first or second delay locked loop circuits to provide an output signal that is phase-shifted for being in synchronism with the reference clock signal, and controlling the multiplexer to provide the output signal of the first one of the at least first and second delay locked loop circuits that is currently in synchronism with the reference clock signal at its output, the control circuit, based upon the output signal of the phase comparator and the delay set in the first one of the at least first or second delay locked loop, determining if the first one of the at least first or second delay locked loop circuits approaches a phase shift range limit beyond which it cannot maintain synchronism with the reference clock signal, and controlling, in accordance with the output signal from the phase comparator in cooperation with the control circuit, a second one of the at least first or second delay locked loop circuits, which has a phase shift range that partly includes and extends beyond the phase shift range limit of the first one of the at least first or second delay locked loop circuits, to provide an output signal that is phase-shifted to be in synchronism with the reference clock signal, controlling the multiplexer to provide the output signal of the second one of the at least first and second delay locked loop circuits that is in synchronism with the reference clock signal at its output, the switching over from the first one to the second one of the at least first and second delay locked loop circuits being effected when both delay locked loop circuits are synchronized, and prior to a next falling or rising edge occurring at either of the respective output signals.

2. The method of claim 1, further including inactivating a delay locked loop circuit the output signal of which is not currently output from the multiplexer in case a switching over between two delay locked loop circuits does not occur within a predetermined minimum time, and reactivating the inactivated circuit when a switchover is imminent.

3. A clock synchronization circuit including at least a first and a second delay locked loop circuit, to respective inputs of which a locally generated clock signal is provided, each of the at least first and second delay locked loop circuits providing an output signal that is phase-shifted with respect to its input signal, and the outputs of the at least first and second delay locked loop circuits being provided to respective inputs of a multiplexer, which multiplexer provides, as a synchronized clock signal, one of the output signals of the at least first and second delay locked loop circuits at its output in accordance with the output signal of a phase comparator in cooperation with a control circuit, each one of the at least first and second delay locked loop circuits providing a portion of a total phase shift of the circuit, wherein the portions of phase shift are arranged to cover adjacent or overlapping phase shift ranges that add up to a total phase shift range of at least 360 degrees phase shift, wherein the control circuit is adapted to control the at least first and second delay locked loop circuits and the multiplexer in accordance with the method of claim 1.

* * * * *